United States Patent
Lai et al.

(10) Patent No.: US 11,637,536 B2
(45) Date of Patent: Apr. 25, 2023

(54) OFFSET CALIBRATION CIRCUIT AND OFFSET CALIBRATION METHOD APPLIED IN SIGNAL PROCESSING CIRCUIT

(71) Applicant: Realtek Semiconductor Corp., HsinChu (TW)

(72) Inventors: Chun-Hao Lai, HsinChu (TW); Chung-Lun Li, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 82 days.

(21) Appl. No.: 17/228,662

(22) Filed: Apr. 12, 2021

(65) Prior Publication Data
US 2022/0115995 A1 Apr. 14, 2022

(30) Foreign Application Priority Data
Oct. 8, 2020 (TW) .................................. 109134976

(51) Int. Cl.
*H03F 3/181* (2006.01)
*H03K 3/013* (2006.01)
*H03F 1/30* (2006.01)

(52) U.S. Cl.
CPC ............ *H03F 3/181* (2013.01); *H03F 1/304* (2013.01); *H03K 3/013* (2013.01); *H03F 2200/03* (2013.01)

(58) Field of Classification Search
CPC ...... H03F 3/181; H03F 1/304; H03F 2200/03; H03F 1/305; H03F 3/183; H03F 3/2175; H03F 3/2171; H03K 3/013; H03M 1/00

USPC ......................................................... 381/120
See application file for complete search history.

(56) References Cited

U.S. PATENT DOCUMENTS

2016/0033560 A1* 2/2016 Thanner ............ G01R 19/16552
324/764.01
2019/0253031 A1* 8/2019 Vellanki ................ H03F 3/2178

FOREIGN PATENT DOCUMENTS

CN       103380569 A  * 10/2013 ............. H03F 1/304
TW         I703817 B      9/2020

OTHER PUBLICATIONS

TRC Electronics, Inc., ARTESYN AXA 10 Series, 2019.*

* cited by examiner

*Primary Examiner* — Jason R Kurr
*Assistant Examiner* — Friedrich Fahnert
(74) *Attorney, Agent, or Firm* — Winston Hsu

(57) ABSTRACT

The present invention provides an offset calibration circuit used in a signal processing circuit, wherein the offset calibration circuit includes a supply voltage detection circuit and a calibration circuit. The supply voltage detection circuit is configured to detect a level of a supply voltage to generate a detection result, wherein the supply voltage is provided to an output stage in the signal processing circuit. The calibration circuit is configured to calculate a digital compensation value according to the detection result, wherein the digital compensation value is used for a digital processing circuit in the signal processing circuit to perform a DC offset calibration.

10 Claims, 3 Drawing Sheets

OFFSET CALIBRATION CIRCUIT AND OFFSET CALIBRATION METHOD APPLIED IN SIGNAL PROCESSING CIRCUIT

BACKGROUND OF THE INVENTION

1. Field of the Invention

The present invention relates to a calibration method for a DC voltage offset generated by an audio processing circuit.

2. Description of the Prior Art

A current audio processing circuit usually uses a class D amplifier as an output stage, and an output signal of the class D amplifier is directly provided to a speaker to play the sound. However, since analog circuits are easily affected by semiconductor process drift during the manufacturing process, there will be a DC offset in the circuit, which may cause P-type transistors and N-type transistors of a digital-to-analog converter and the class D amplifier have different DC voltage offsets, which causes the user to hear pop noise from the speaker when the class D amplifier is powered on.

In order to avoid the DC voltage offset caused by the semiconductor process drift, the audio processing circuit usually includes a calibration circuit to provide a fixed compensation value to compensate the DC voltage offset. However, the DC voltage offset in the analog circuit is easily affected by the supply voltage. Therefore, if the audio processing circuit is installed in a battery-powered electronic device, when the supply voltage changes due to the change in battery power, the fixed compensation value provided by the calibration circuit cannot accurately calibrate the actual DC voltage offset of the audio processing circuit, and the popping phenomenon may still occur.

SUMMARY OF THE INVENTION

It is therefore an objective of the present invention to provide an offset calibration circuit, which can adjust the compensation value according to the supply voltage of the output stage, so as to accurately eliminate the DC voltage offset in the audio processing circuit to solve the above-mentioned problems.

According to one embodiment of the present invention, an offset calibration circuit used in a signal processing circuit is disclosed, wherein the offset calibration circuit comprises a supply voltage detection circuit and a calibration circuit. The supply voltage detection circuit is configured to detect a level of a supply voltage to generate a detection result, wherein the supply voltage is provided to an output stage in the signal processing circuit. The calibration circuit is configured to calculate a digital compensation value according to the detection result, wherein the digital compensation value is used for a digital processing circuit in the signal processing circuit to perform a DC offset calibration.

According to another embodiment of the present invention, an offset calibration method applied in a signal processing circuit comprises the steps of: detecting a level of a supply voltage to generate a detection result, where the supply voltage is provided to an output stage in the signal processing circuit; and calculating a digital compensation value according to the detection result, wherein the digital compensation value is used for a digital processing circuit in the signal processing circuit to perform a DC offset calibration.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
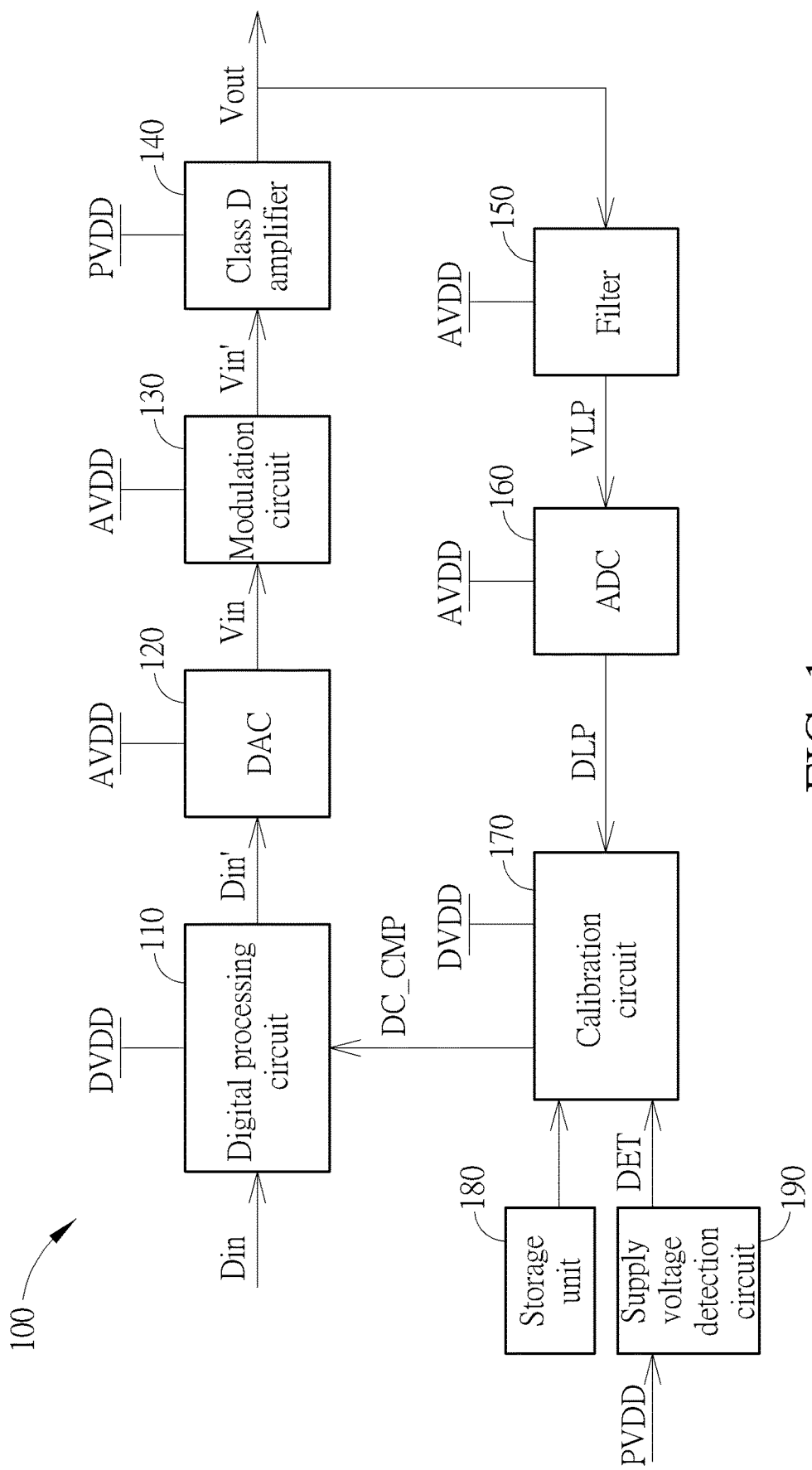
FIG. 1 is a diagram illustrating a signal processing circuit according to one embodiment of the present invention.

FIG. 1 is a diagram illustrating a signal processing circuit 100 according to one embodiment of the present invention. As shown in FIG. 1, the signal processing circuit 100 comprises a digital processing circuit 110, a digital-to-analog converter (DAC) 120, a modulation circuit 130, an output stage (in this embodiment, a class D amplifier 140 serves as the output stage), a filter 150, an analog-to-digital converter (ADC) 160 and an offset calibration circuit, wherein the offset calibration circuit comprises a calibration circuit 170, a storage unit 180 and a supply voltage detection circuit 190. In this embodiment, the signal processing circuit 100 is an audio processing circuit. The digital processing circuit 110 and the calibration circuit 170 use a supply voltage DVDD for power supply; the DAC 120, the modulation circuit 130, the filter 150 and the ADC 160 use a supply voltage AVDD for power supply; and the class D amplifier 140 uses a supply voltage PVDD for power supply. Each of the supply voltages DVDD and AVDD is provided by a voltage regulator that outputs a stable DC voltage such as 1.8V or 3.3V, and the supply voltage PVDD is directly supplied by a battery to avoid excessive voltage conversion losses, that is the value of the supply voltage PVDD varies with the battery capacity. In this embodiment, the signal processing circuit 100 can be set in a notebook, a tablet, a mobile phone or other portable devices, and the signal processing circuit 100 is used to receive a digital signal (this embodiment uses a digital audio signal Din as an example) to generate an output signal (in this embodiment, an output audio signal Vout) to a speaker for playback.

Figure 2:
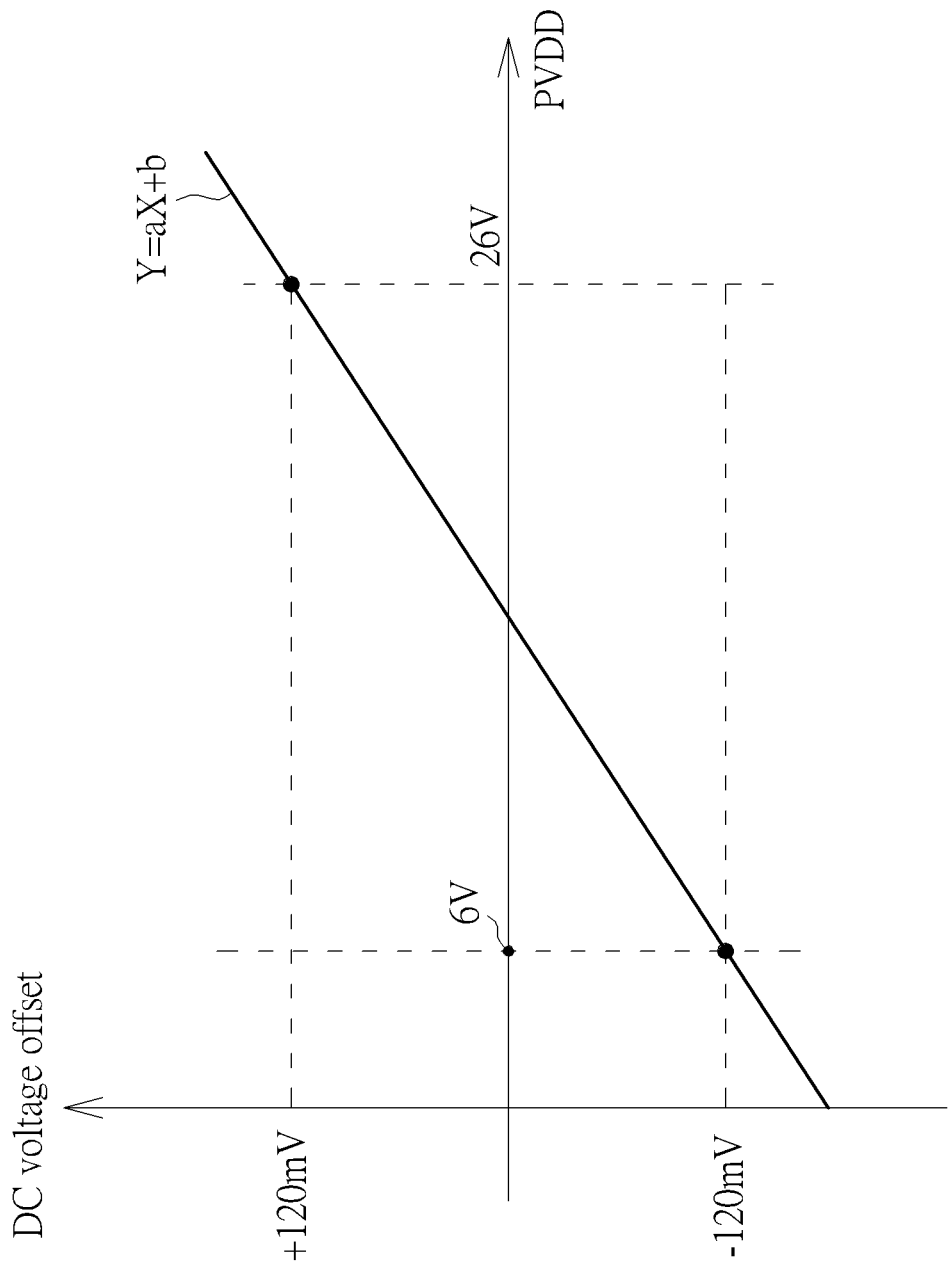
FIG. 2 shows relationship between a DC voltage offset and a supply voltage.

In the signal processing circuit 100, the analog circuits such as the DAC 120, the modulation circuit 130 and the class D amplifier 140 have the DC voltage offsets due to the semiconductor process drift, so that the DC voltage (i.e., common mode voltage) on the P-type transistor and the N-type transistor within the class D amplifier 140 is inconsistent. Therefore, in order to eliminate or compensate the DC voltage offset, when the signal processing circuit 100 is tested in a factory, engineers will apply different supply voltages PVDD to the class D amplifier 140, and then measure the DC voltage offsets of the Class D amplifier under different supply voltages PVDD, and record the relevant parameters in the storage unit 180. In detail, since experimental observations have found that the DC voltage offset and the supply voltage PVDD are in a linear relationship, therefore, assuming that the supply voltage PVDD can vary from 6V to 26V, the engineer can set the supply voltage PVDD from 6V to 26V, and respectively measure the corresponding DC voltage offsets, to have a curve as shown in FIG. 2. Then, based on the measured DC voltage offsets corresponding to the supply voltages PVDD (6V and 26V), a linear equation Y=a*X+b is calculated, where 'Y' is the DC voltage offset, 'X' is the supply voltage PVDD, and 'a' and 'b' are the calculated slope and constant, respectively. Finally, the parameters 'a' and 'b' can be stored in the storage unit 180, and the storage unit 180 can be an electronic fuse (e-Fuse) in this embodiment.

It should be noted that the numerical values and related calculation methods shown in FIG. 2 are merely illustrative and are not limitations of the present invention. In other embodiments, as long as the storage unit 180 can be used to store parameters for calculating the DC voltage offset under different supply voltages PVDD, such as multiple different supply voltages PVDD and corresponding DC voltage offsets, the stored parameters are not limited to the parameters 'a' and 'b'.

In the operation of the signal processing circuit 100, when the signal processing circuit 100 is powered on and starts to receive the digital audio signal Din, the supply voltage detection circuit 190 detects a level of the current supply voltage PVDD to generate a detection result DET, where the detection result DET can be a multi-bit digital code, such as a 30-bit thermal code. Then, the calibration circuit 170 retrieves the relevant parameters of the DC voltage offset from the storage unit 180, such as the parameters 'a' and 'b' shown in FIG. 2, and the calibration circuit 170 calculates a digital compensation value DC_CMP according to the parameters and the detection result DET indicating the level of the current supply voltage PVDD. For example, assuming that the calibration circuit 170 calculates that the current DC voltage offset is "60 mV", the digital compensation value DC_CMP can be used to add a digital signal corresponding to the DC voltage offset of "−60 mV" in the path.

The digital processing circuit 110 receives the digital compensation value DC_CMP from the calibration circuit 170, and performs compensation and digital filtering on the digital audio signal Din based on the digital compensation value DC_CMP to generate a processed signal Din', wherein a difference between the processed signal Din' and the digital audio signal Din is used to eliminate the DC voltage offset caused by the DAC 120, the modulation circuit 130 and the class-D amplifier 140. Then, the DAC 120 performs a digital-to-analog conversion operation on the processed signal Din' to generate an analog signal Vin. Then, the modulation circuit 130 modulates the analog signal Vin to generate a modulated signal Vin' that is sent to the class D amplifier 140 for amplifying operation to generate the output audio signal Vout, wherein the output audio signal Vout is a pulse width modulation signal.

In addition, the filter 150 can perform a low-pass filtering operation on the output audio signal Vout to generate a filtered signal VLP, the ADC 160 performs an analog-to-digital conversion operation on the filtered signal VLP to generate a digitally filtered signal DLP, and the calibration circuit 170 analyzes the digital filtered signal DLP to determine the DC voltage or the DC voltage offset of the current output audio signal Vout for the subsequent adjustment of the digital compensation value DC_CMP.

In the embodiment shown in FIG. 1, when the signal processing circuit 100 is powered on, the calibration circuit 170 can accurately generate the digital compensation value DC_CMP to pre-compensate the digital audio signal Din to eliminate the DC offset that will caused by the DAC 120, the modulation circuit 130 and the class D amplifier 140. Therefore, the signal processing circuit 100 does not need to continuously correct/adjust the DC voltage offset through the feedback system for a long time, or even the signal processing circuit 100 does not need to correct the DC voltage offset later through the feedback system.

In the above embodiments, the digital compensation value DC_CMP is generated immediately after the signal processing circuit 100 is powered on, for subsequent calibration after receiving the digital audio signal Din. In another embodiment, when the output audio signal Vout is not played through the speaker, for example, the user controls the signal processing circuit 100 to mute (silent mode), the supply voltage detection circuit 190 can detect the level of the current supply voltage PVDD again, and generate the detection result DET to the calibration circuit 170 to calculate the updated digital compensation value DC_CMP.

Figure 3:
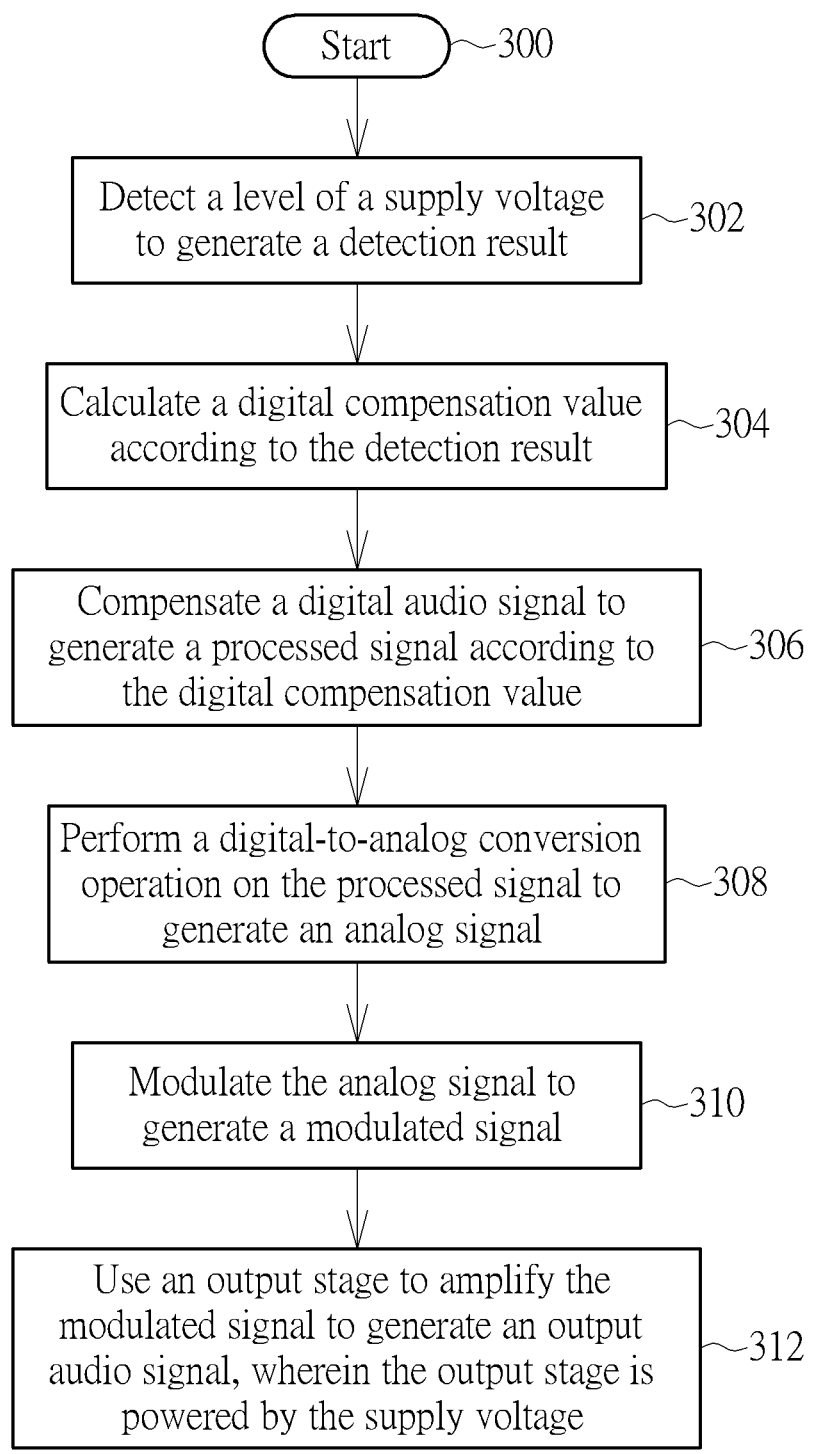
FIG. 3 is a flowchart of a signal processing method according to one embodiment of the present invention.

FIG. 3 is a flowchart of a signal processing method according to one embodiment of the present invention. With reference to FIG. 1, FIG. 2 and descriptions in the above embodiments, the flow is as follows.

Step 300: the flow starts.

Step 302: detect a level of a supply voltage to generate a detection result.

Step 304: calculate a digital compensation value according to the detection result.

Step 306: compensate a digital audio signal to generate a processed signal according to the digital compensation value.

Step 308: perform a digital-to-analog conversion operation on the processed signal to generate an analog signal.

Step 310: modulate the analog signal to generate a modulated signal.

Step 312: use an output stage to amplify the modulated signal to generate an output audio signal, wherein the output stage is powered by the supply voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An offset calibration circuit used in a signal processing circuit, comprising:
a supply voltage detection circuit, configured to detect a level of a supply voltage to generate a detection result, wherein the supply voltage is provided to an output stage in the signal processing circuit; and
a calibration circuit, configured to calculate a digital compensation value according to the detection result, wherein the digital compensation value is used for a digital processing circuit in the signal processing circuit to perform a DC offset calibration.

2. The offset calibration circuit of claim 1, further comprising:
a storage unit, configured to store a plurality of parameters;
wherein the calibration circuit calculates a DC voltage offset according to the plurality of parameters and the detection result, and the calibration circuit further determines the digital compensation value according to the DC voltage offset.

3. The offset calibration circuit of claim 2, wherein the plurality of parameters comprise a slope and a constant, and the calibration circuit multiplies the slope by the level of the supply voltage indicated by the detection result and then adds the constant to calculate the DC voltage offset.

4. The offset calibration circuit of claim 1, wherein the signal processing circuit comprises:

the digital processing circuit, configured to compensate a digital signal according to the digital compensation value to generate a processed signal;
a digital-to-analog converter, configured to perform a digital-to-analog conversion operation on the processed signal to generate an analog signal;
a modulation signal, configured to generate a modulated signal according to the analog signal; and
the output stage, configured to receive the modulated signal to generate an output signal.

5. The offset calibration circuit of claim 4, wherein the output signal is an output audio signal, and the calibration circuit starts to generate the digital compensation value to the digital processing circuit only when the output audio signal is not played by a speaker.

6. The offset calibration circuit of claim 4, wherein the signal processing circuit further comprises:
a filter, configured to perform a low-pass filtering operation on the output signal to generate a filtered signal; and
a analog-to-digital converter, configured to perform an analog-to-digital conversion operation on the filtered signal to generate a digital filtered signal;
wherein the calibration circuit further adjusts the digital compensation value according to the digital filtered signal.

7. The offset calibration circuit of claim 4, wherein the signal processing circuit is in a portable device with a battery, the supply voltage of the output stage is directly provided by the battery, and the digital-to-analog converter and the modulation circuit are supplied by another supply voltage provided by a voltage regulator.

8. An offset calibration method applied in a signal processing circuit, comprising:
detecting a level of a supply voltage to generate a detection result, where the supply voltage is provided to an output stage in the signal processing circuit; and
calculating a digital compensation value according to the detection result, wherein the digital compensation value is used for a digital processing circuit in the signal processing circuit to perform a DC offset calibration.

9. The offset calibration method of claim 8, wherein the step of calculating the digital compensation value according to the detection result comprises:
calculating a DC voltage offset according to a plurality of parameters and the detection result; and
determining the digital compensation value according to the DC voltage offset.

10. The offset calibration method of claim 9, wherein the plurality of parameters comprise a slope and a constant, and the step of calculating the DC voltage offset according to the plurality of parameters and the detection result comprises:
multiplying the slope by the level of the supply voltage indicated by the detection result and then adds the constant to calculate the DC voltage offset.

* * * * *